United States Patent
Stumpf et al.

(10) Patent No.: US 11,408,508 B2
(45) Date of Patent: Aug. 9, 2022

(54) PISTON RING

(71) Applicant: FEDERAL-MOGUL BURSCHEID GMBH, Burscheid (DE)

(72) Inventors: Walter Stumpf, Essen (DE); Steffen Hoppe, Overath (DE); Ralf Lammers, Wermelskirchen (DE); Rudolf Linde, Wermelskirchen (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 32 days.

(21) Appl. No.: 16/768,572

(22) PCT Filed: Nov. 28, 2018

(86) PCT No.: PCT/EP2018/082789
§ 371 (c)(1),
(2) Date: May 29, 2020

(87) PCT Pub. No.: WO2019/105979
PCT Pub. Date: Jun. 6, 2019

(65) Prior Publication Data
US 2020/0309263 A1 Oct. 1, 2020

(30) Foreign Application Priority Data
Nov. 30, 2017 (DE) .................. 10 2017 221 606.9

(51) Int. Cl.
*F16J 9/26* (2006.01)
*C23C 28/00* (2006.01)
(Continued)

(52) U.S. Cl.
CPC .............. *F16J 9/26* (2013.01); *C23C 14/0605* (2013.01); *C23C 28/322* (2013.01);
(Continued)

(58) Field of Classification Search
CPC ...... F16J 9/26; C23C 14/0605; C23C 28/343; C23C 28/347
(Continued)

(56) References Cited

U.S. PATENT DOCUMENTS

| 4,846,940 A | 7/1989 | Neuhaeuser et al. |
| 6,013,380 A | 1/2000 | Harayama et al. |

(Continued)

FOREIGN PATENT DOCUMENTS

| CN | 201031737 Y | * | 3/2008 |
| CN | 201031737 Y | † | 3/2008 |

(Continued)

OTHER PUBLICATIONS

International Search Report, dated Apr. 3, 2019 (PCT/EP2018/082789).

(Continued)

*Primary Examiner* — Archene A Turner
(74) *Attorney, Agent, or Firm* — Robert L. Stearns; Dickinson Wright, PLLC

(57) ABSTRACT

A piston ring (10) has a running surface (12) and a flank surface (14) which are coated. The uppermost layer of the running surface (12) is a hydrogen-containing or a hydrogen-free DLC layer, and the uppermost layer of at least one flank surface (14) is a chromium layer. A method of producing a piston ring (10) includes forming a DLC layer as the uppermost layer of the running surface (12), and forming a chromium layer as the uppermost layer of at least one flank surface (14).

18 Claims, 1 Drawing Sheet

(51) Int. Cl.
 *C23C 14/06* (2006.01)
 *F02F 5/00* (2006.01)
(52) U.S. Cl.
 CPC .......... *C23C 28/343* (2013.01); *C23C 28/347* (2013.01); *F02F 5/00* (2013.01)
(58) Field of Classification Search
 USPC ........................................................ 428/408
 See application file for complete search history.

(56) References Cited

U.S. PATENT DOCUMENTS

| | | | |
|---|---|---|---|
| 6,325,385 | B1 | 12/2001 | Iwashita et al. |
| 9,404,578 | B2 † | 8/2016 | Herbst-Dederichs |
| 9,447,490 | B2 † | 9/2016 | Hoppe |
| 9,464,717 | B2 * | 10/2016 | Ito .............................. F16J 9/26 |
| 10,344,860 | B2 † | 7/2019 | Hirase |
| 2005/0005892 | A1 * | 1/2005 | Nishimura ........... C10M 145/14 123/193.4 |
| 2008/0136116 | A1 † | 6/2008 | Sarabanda |
| 2010/0019458 | A1 | 1/2010 | Esser et al. |
| 2011/0115167 | A1 | 5/2011 | Linde |
| 2013/0140776 | A1 | 6/2013 | Kennedy |
| 2016/0312891 | A1 | 10/2016 | Kantola et al. |
| 2016/0341312 | A1 | 11/2016 | Kennedy et al. |
| 2017/0102071 | A1 | 4/2017 | Banfield et al. |
| 2017/0159816 | A1 | 6/2017 | Bauer |
| 2017/0167609 | A1 | 6/2017 | Chida et al. |

FOREIGN PATENT DOCUMENTS

| | | | |
|---|---|---|---|
| CN | 201162585 | Y | 12/2008 |
| CN | 101328603 | B † | 7/2010 |
| CN | 101929405 | A † | 12/2010 |
| CN | 201818384 | U † | 5/2011 |
| CN | 102741535 | A | 10/2012 |
| CN | 102777281 | A | 11/2012 |
| CN | 203584733 | U † | 5/2014 |
| CN | 204572232 | U † | 8/2015 |
| CN | 105579749 | A † | 5/2016 |
| CN | 206617243 | U † | 11/2017 |
| CN | 107059003 | B † | 5/2019 |
| DE | 3531410 | A1 | 3/1987 |
| DE | 69711722 | T2 | 8/2002 |
| DE | 102006003480 | B3 † | 7/2007 |
| DE | 102007007961 | A1 | 8/2008 |
| DE | 102007038188 | A1 | 2/2009 |
| DE | 102008017270 | B3 | 6/2009 |
| DE | 102011003254 | | 8/2012 |
| DE | 102014200607 | A1 | 7/2015 |
| DE | 102014213822 | A1 | 1/2016 |
| DE | 102016217557 | A1 | 4/2017 |
| EP | 3163130 | | 5/2017 |
| EP | 2998617 | B1 † | 3/2020 |
| GB | 2344150 | A | 5/2000 |
| JP | 2005009433 | A | 1/2005 |
| JP | 5013445 | B2 † | 8/2012 |
| WO | 2012100847 | A1 | 8/2012 |
| WO | 2016172071 | A1 | 10/2016 |

OTHER PUBLICATIONS

International Standard ISO 6621-4, 36 pages, Oct. 15, 2003, International Organization for Standardization, Switzerland.†

\* cited by examiner
† cited by third party

PISTON RING

BACKGROUND

1. Technical Field

The invention relates to a piston ring.

High requirements are placed on piston rings of internal combustion engines with regard to lowest possible wear and lowest possible friction.

2. Related Art

In this regard, there is known from DE 10 2014 213 822 a piston ring having, in particular as regards good wear behavior, a DLC layer on the running, in other words lateral surface. The flank surfaces are nitrided but can have a coating.

DE 10 2007 038 188 A1 relates to a piston ring having a galvanic chromium layer, onto which a PVD layer is applied.

SUMMARY

Against this background, the invention is based on the object of providing a piston ring that is improved in terms of wear behavior and/or friction and/or production efforts.

Accordingly, an embodied piston ring has coated running surfaces and flank surfaces, wherein the uppermost layer of the running surface is a DLC layer, and the uppermost layer of at least one flank surface is a chromium layer. Preferably, at least the lower flank surface, in other words the flank surface of a piston ring that is intended to be facing away from the combustion chamber, is coated. The second flank surface can be uncoated or coated, in particular be provided with a chromium layer. The DLC layer on the running surface ensures low wear and comparatively low friction and is, moreover, burn-mark resistant. Compared to a DLC layer, the chromium layer on at least one flank surface can be applied easier and more cost-effective and additionally ensures low wear in this area.

Moreover, the topic of friction reduction in internal combustion engines is becoming increasingly important in general, and the chromium layer on at least one flank surface makes an advantageous contribution to this end. The movement of the piston ring during operation also results in axial and/or radial friction which is expected to be comparatively low with the chromium layer according to the invention. Moreover, compared to nitrided flanks, there is also the advantage of reduced wear on both the flank surfaces of the piston ring and the piston ring groove, especially under high load and/or adverse lubrication conditions. In tests using a steel piston for the chromium coating according to the invention, wear reduced by more than 50% and significantly reduced friction could be ascertained compared to nitrided chromium steel.

Reduced wear is also relevant in view of what is called a blow-by, in other words an unwanted oil flow past the oil wiper ring. High wear on the lower flanks of piston rings in the first groove causes increased blow-by. If this blow-by exceeds the oil separation effect of the engine ventilation, oil is transported out of the crankcase via the blow-by-flow, and the oil consumption of the engine rises in an unacceptable manner. Moreover, if wear on the flank surfaces is too high, the piston ring in the groove can rotate with the running surface downward in the event of loads such that the lower edge of the running surface wipes off oil in a less favorable way, and oil consumption increases. Finally, if there is extreme wear on the flank surfaces, optionally in combination with wear of the piston ring groove, the piston ring can break due to too high axial clearance in the groove.

Particularly favorable properties are expected for the DLC layer if it is hydrogen-free. However, a hydrogen-containing DLC layer can also be advantageous in specific applications.

Since it offers advantages for the technical process to form first the chromium layer, the DLC layer can be formed in areas on a chromium layer. This applies to both running surfaces and flank surfaces.

In particular, it can be advantageous for the production if the DLC layer partially overlaps the chromium layer at least in the area of the peripheral edges. The chromium layer can taper off towards the peripheral edge and/or the peripheral edges can be processed at a defined angle.

A PVD (Physical Vapor Deposition) process is preferred for the formation of the DLC layer.

Particular advantages, especially with regard to low wear, are expected if the chromium layer has a hardness of at least 800 HV 0.1.

In view of the possible particle deposits, it is preferred for the crack density of the chromium layer that it has a crack rate of 700 to 1200 cracks/cm.

With respect to a specific reduction of friction in the area of the flank surfaces, it is preferred that the chromium layer has a friction coefficient in lubricated friction contact, which is at least 20% lower than that of nitrided chromium steel.

On the basis of positive experience, it is preferred that the chromium layer is produced by galvanic formation.

In particular, the chromium layer can be processed, preferably combined with an galvanic application, in such a way that the roughness of the flank surfaces is subsequently less than Rz 4.

To further improve its properties, the chromium layer may have particle deposits which can be particularly embedded in the crack network of the chromium layer.

It should be noted at this point that all of the method steps given above and below for the piston ring according to the invention are also preferred, and vice versa.

It is advantageous in particular for the process sequence if the chromium layer is in particular galvanically formed prior to the DLC layer. This allows to avoid problems of the poor conductivity of DLC, which would impede the galvanic process, the undesired formation of hydrogen gas during chromium plating and the chemical aggressiveness of the chromium electrolyte towards DLC.

BRIEF DESCRIPTION OF THE DRAWINGS

An embodiment example of the invention shown in the drawings will be described in more detail below. In which.

DETAILED DESCRIPTION

Figure 1:
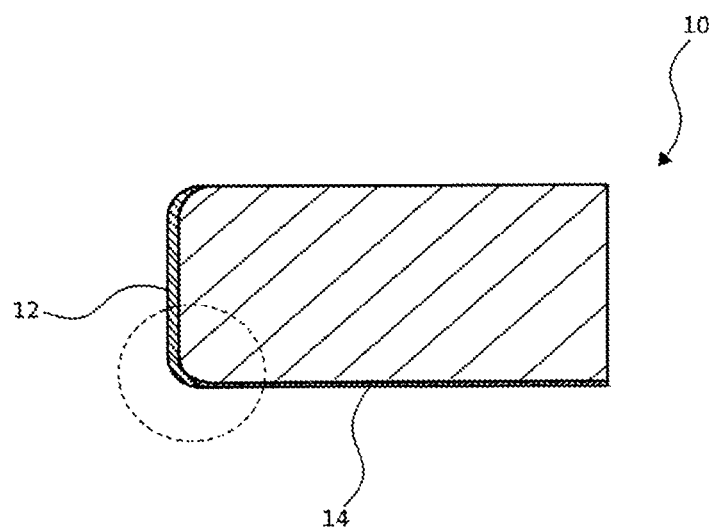
FIG. 1 shows a cross-section through a piston ring according to the invention[[,]]

As can be seen in FIG. 1, a piston ring 10 according to an embodiment typically has a rectangular cross-section having a running surface 12 and, extending substantially perpendicular thereto, flank surfaces, the lower flank surface of which is designated with 14. In the preferred embodiment example shown, the lower flank surface 14 is coated with a chromium layer and the running surface with a DLC layer. Here, the preferred measure is shown, according to which the DLC layer overlaps the chromium layer especially in the transition area between running surface 12 and flank surface 14. In the example shown, the transition is rounded, but it can just as well be beveled.

Figure 2:
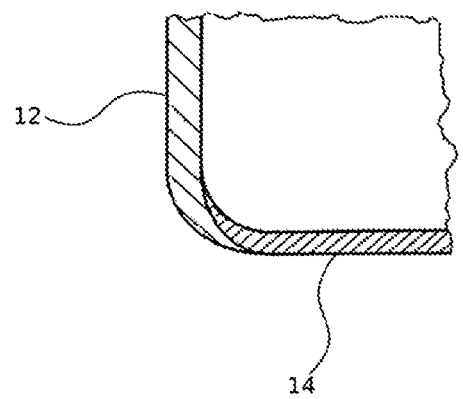
FIG. 2 shows the area marked in FIG. 1 on an enlarged scale.

As can be seen in particular in FIG. 2, the chromium layer extends with decreasing thickness to the running surface 12 (vertical in the figures), and the DLC layer extends, also with decreasing thickness, up to approximately the beginning of the flank surface 14 (horizontal in the figure).

The invention claimed is:

1. A piston ring (10) having at least one running surface (12) and flank surfaces (14) which are coated, wherein an uppermost layer of the running surface (12) is a hydrogen-containing or hydrogen-free DLC layer and an uppermost layer of at least one of the flank surfaces (14) is a chromium layer.

2. The piston ring (10) according to claim 1, wherein the DLC layer is hydrogen-free.

3. The piston ring (10) according to claim 1 including a chromium layer at least in some areas below the DLC layer.

4. The piston ring (10) according to claim 3, wherein the DLC layer at least partially overlaps the chromium layer in the area of the peripheral edges.

5. The piston ring (10) according to claim 1, wherein the DLC layer is formed by a PVD process.

6. The piston ring (10) according to claim 1, wherein the chromium layer has a hardness of at least 800 HV 0.1.

7. The piston ring (10) according to claim 1, wherein the chromium layer has a crack density with a crack rate of 700 to 1200 cracks/cm.

8. The piston ring (10) according to claim 1, wherein in lubricated friction contact, a friction coefficient of the chromium layer is at least 20% lower than that of nitrided chromium steel.

9. The piston ring (10) according to claim 1, wherein the chromium layer is galvanically formed.

10. The piston ring (10) according to claim 1, wherein the flank surface (14) has a roughness of less than Rz 4.

11. The piston ring (10) according to claim 1, wherein the chromium layer has particle deposits.

12. A method for producing a piston ring (10), in which a DLC layer is formed as the uppermost layer of a running surface (12) of the piston ring, and a chromium layer is formed as the uppermost layer of at least one flank surface (14) of the piston ring.

13. The method according to claim 12 wherein the DLC layer is formed by a PVD process.

14. The method according to claim 12 wherein the chromium layer is galvanically formed.

15. The method according to claim 12, wherein the chromium layer is formed prior to the DLC layer.

16. The method according to claim 12, wherein the chromium layer is processed so as to have a roughness of less than Rz 4.

17. The piston ring according to claim 1, wherein the piston ring has an upper flank surface and a lower flank surface, and wherein the flank surface to which the chromium layer is applied is the lower flank surface.

18. A piston ring, comprising:
a ring body having upper and lower flank surfaces and an outer running surface;
a DLC layer applied directly to the outer running surface; and
a chromium layer applied directly to at least one of the flank surfaces.

* * * * *

EX PARTE REEXAMINATION CERTIFICATE (13118th)

United States Patent
Stumpf et al.

(10) Number: US 11,408,508 C1
(45) Certificate Issued: Dec. 16, 2025

(54) PISTON RING

(71) Applicant: FEDERAL-MOGUL BURSCHEID GMBH, Burscheid (DE)

(72) Inventors: Walter Stumpf, Essen (DE); Steffen Hoppe, Overath (DE); Ralf Lammers, Wermelskirchen (DE); Rudolf Linde, Wermelskirchen (DE)

(73) Assignee: FEDERAL-MOGUL BURSCHEID GMBH, Burscheid (DE)

Reexamination Request:
No. 90/019,687, Sep. 30, 2024

Reexamination Certificate for:
Patent No.: 11,408,508
Issued: Aug. 9, 2022
Appl. No.: 16/768,572
PCT Filed: Nov. 28, 2018
PCT No.: PCT/EP2018/082789
§ 371 (c)(1),
(2) Date: May 29, 2020
PCT Pub. No.: WO2019/105979
PCT Pub. Date: Jun. 6, 2019

(51) Int. Cl.
*F16J 9/26* (2006.01)
*C23C 14/06* (2006.01)
*C23C 28/00* (2006.01)
*F02F 5/00* (2006.01)

(52) U.S. Cl.
CPC ............. *F16J 9/26* (2013.01); *C23C 14/0605* (2013.01); *C23C 28/322* (2013.01); *C23C 28/343* (2013.01); *C23C 28/347* (2013.01); *F02F 5/00* (2013.01)

(58) Field of Classification Search
None
See application file for complete search history.

(56) References Cited

To view the complete listing of prior art documents cited during the proceeding for Reexamination Control Number 90/019,687, please refer to the USPTO's Patent Electronic System.

*Primary Examiner* — Joseph R Kosack

(57) ABSTRACT

A piston ring (10) has a running surface (12) and a flank surface (14) which are coated. The uppermost layer of the running surface (12) is a hydrogen-containing or a hydrogen-free DLC layer, and the uppermost layer of at least one flank surface (14) is a chromium layer. A method of producing a piston ring (10) includes forming a DLC layer as the uppermost layer of the running surface (12), and forming a chromium layer as the uppermost layer of at least one flank surface (14).

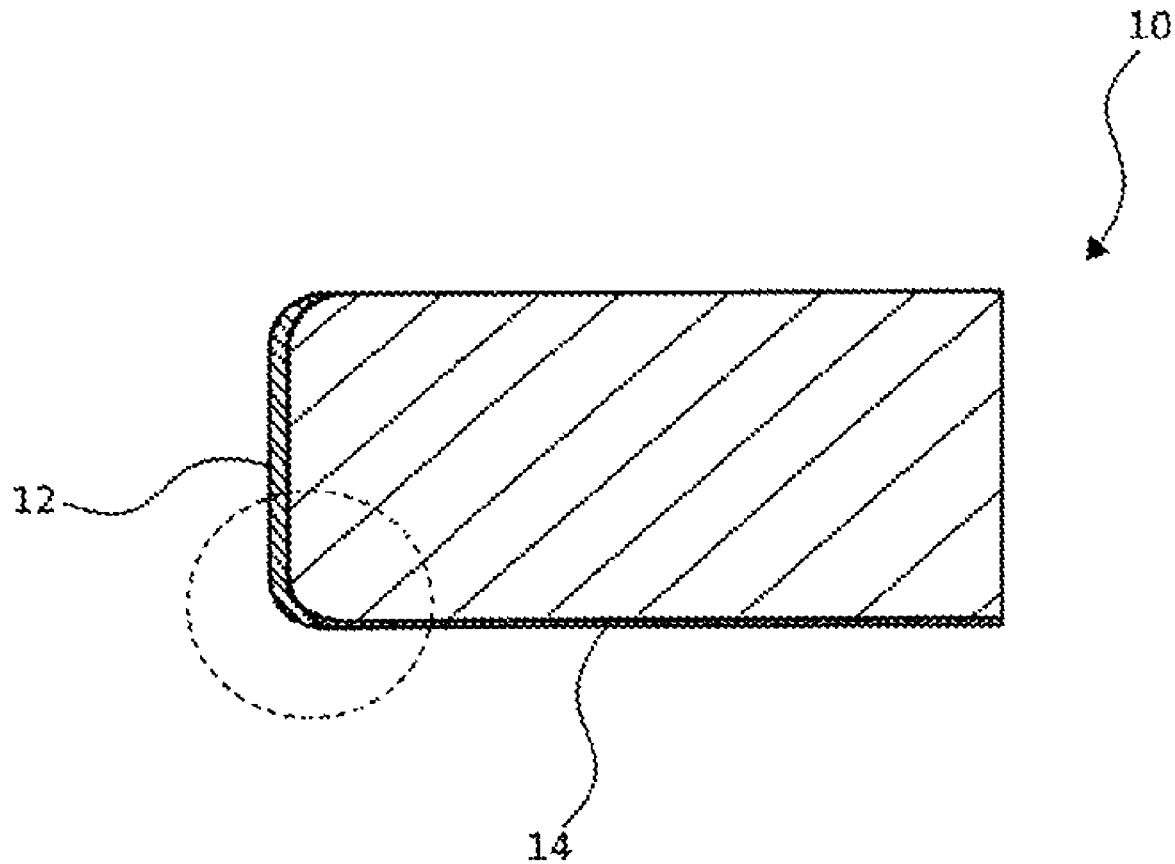

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 18 is confirmed.

Claims 1-12 and 14 are determined to be patentable as amended.

Claims 13 and 15-17, dependent on an amended claim, are determined to be patentable.

New claims 19-24 are added and determined to be patentable.

1. A piston ring [(10)] having at least one running surface [(12)] and flank surfaces [(14)] which are coated, wherein an uppermost layer of *a coating on* the running surface [(12)] is a hydrogen-containing or hydrogen-free DLC layer and an uppermost layer of *a coating on* at least one of the flank surfaces [(14)] is a chromium layer *formed by a galvanic process, and wherein a chromium layer formed by a galvanic process is not disposed below the DLC layer on the running surface.*

2. The piston ring [(10)] according to claim 1, wherein the DLC layer is hydrogen-free.

3. The piston ring [(10)] according to claim 1 including a chromium layer at least in some areas below the DLC layer.

4. [The] *A* piston ring [(10) according to claim 3] *having a running surface and a flank surface, the piston ring including a coating on the running surface and the flank surface, wherein an uppermost layer of the coating on the running surface is a DLC layer and an uppermost layer of the coating on the flank surface is a chromium layer*, wherein the DLC layer [at least partially] overlaps the chromium layer *only* in [the] *an* area of [the] *peripheral edges of the running surface and the flank surface, and a chromium layer formed by a galvanic process is not disposed below the DLC layer on the running surface beyond the area of the peripheral edges.*

5. The piston ring [(10)] according to claim 1, wherein the DLC layer is formed by a PVD process.

6. The piston ring [(10)] according to claim 1, wherein the chromium layer has a hardness of at least 800 HV 0.1.

7. The piston ring [(10)] according to claim 1, wherein the chromium layer has a crack density with a crack rate of 700 to 1200 cracks/cm.

8. The piston ring [(10)] according to claim 1, wherein in lubricated friction contact, a friction coefficient of the chromium layer is at least 20% lower than that of nitrided chromium steel.

9. The piston ring [(10)] according to claim [1] *4*, wherein the chromium layer *disposed on the flank surface* is galvanically formed.

10. The piston ring [(10)] according to claim 1, wherein the flank surface [(14)] has a roughness of less than Rz 4.

11. The piston ring [(10)] according to claim 1, wherein the chromium layer has particle deposits.

12. A method for producing a piston ring [(10), in which] *having a running surface, at least one flank surface, and a transition area at peripheral edges of the running surface and the at least one flank surface, comprising:*

*forming a chromium layer as an uppermost layer of the at least one flank surface;*

*forming* a DLC layer [is formed] as the uppermost layer of [a] *the* running surface [(12)] of the piston ring [, and a chromium layer is formed as the uppermost layer of at least one flank surface (14) of the piston ring] *such that the DLC layer overlaps the chromium layer in the transition area;*

*and wherein a chromium layer formed by a galvanic process is not formed below the DLC layer on the running surface beyond the transition area.*

14. The method according to claim 12 [wherein the] *including forming a* chromium layer [is galvanically formed] *below the DLC layer on the running surface.*

19. *The piston ring according to claim 18, wherein the DLC layer is hydrogen-free.*

20. *The piston ring according to claim 18, wherein the chromium layer is formed by a galvanic process and is not disposed below the DLC layer.*

21. *The piston ring according to claim 1 including a transition surface between the running surface and one of the flank surfaces, wherein the transition surface is beveled.*

22. *The piston ring according to claim 1, wherein the DLC layer is hydrogen-free; the DLC layer is formed by a PVD process; the chromium layer formed by the galvanic process has a hardness of at least 800 HV 0.1; the chromium layer has a crack density with a crack rate of 700 to 1200 cracks/cm; wherein in lubricated friction contact, a friction coefficient of the chromium layer formed by the galvanic process is at least 20% lower than that of nitrided chromium steel.*

23. *The piston ring according to claim 4, wherein the DLC layer is hydrogen-free.*

24. *The piston ring according to claim 4 including a transition surface between the running surface and one of the flank surfaces, wherein the transition surface is beveled.*

\* \* \* \* \*